United States Patent
Ikeda et al.

(10) Patent No.: US 9,844,126 B2
(45) Date of Patent: Dec. 12, 2017

(54) PLASMA TREATMENT APPARATUS

(75) Inventors: Masayoshi Ikeda, Hachioji (JP);
Kiyotaka Sakamoto, Tama (JP);
Akihiro Sawada, Kawasaki (JP);
Yasumi Sago, Tachikawa (JP); Masami Hasegawa, Tama (JP); Motozo Kurita, Fuchu (JP)

(73) Assignee: Canon Aneiva Corporation, Kawasaki-shi (JP)

( * ) Notice: Subject to any disclaimer, the term of this patent is extended or adjusted under 35 U.S.C. 154(b) by 891 days.

(21) Appl. No.: 13/524,170

(22) Filed: Jun. 15, 2012

(65) Prior Publication Data

US 2012/0298303 A1    Nov. 29, 2012

Related U.S. Application Data

(63) Continuation of application No. PCT/JP2011/006459, filed on Nov. 21, 2011.

(30) Foreign Application Priority Data

Nov. 30, 2010  (JP) .................................. 2010-267321
Sep. 5, 2011   (JP) .................................. 2011-192372

(51) Int. Cl.
*C23C 16/00* (2006.01)
*H01L 21/306* (2006.01)
(Continued)

(52) U.S. Cl.
CPC .............. *H05H 1/46* (2013.01); *H01J 37/321* (2013.01); *H01J 37/3211* (2013.01);
(Continued)

(58) Field of Classification Search
CPC ............. H01J 37/3211; H01J 37/32119; H01J 37/32128; H01J 37/32146;
(Continued)

(56) References Cited

U.S. PATENT DOCUMENTS 5,401,318 A * 3/1995 Pearson ................ H01J 37/321
                                                    118/723 AN
5,567,268 A * 10/1996 Kadomura ............ H01J 37/321
                                                    156/345.28
(Continued)

FOREIGN PATENT DOCUMENTS

JP        10-83896 A        3/1998
JP        10-172790 A       6/1998
(Continued)

OTHER PUBLICATIONS

Office Action in Korean Patent Application No. 10-2012-7019413, dated Oct. 23, 2013 (9 pages).
(Continued)

*Primary Examiner* — Luz L Alejandro Mulero
(74) *Attorney, Agent, or Firm* — Fitzpatrick, Cella, Harper Scinto

(57) ABSTRACT

Provided is a plasma treatment apparatus capable of uniform substrate treatment by correction of unevenness in a plasma density distribution. The apparatus has a configuration such that a substrate is treated with plasma, and an evacuated container is provided with an annular antenna arranged around an outer periphery of the container, and is formed of a power supply container, and a process container where the substrate is placed, which communicates with an internal space of the power supply container. The plasma is generated in the power supply container by radio-frequency power supplied to the antenna. The plasma is diffused into the process container by a magnetic field of solenoid coils arranged around an outer periphery of the antenna. The inclination of the magnetic field is adjusted by an inclination adjustment means for adjusting the inclination of the solenoid coils with respect to the process substrate.

5 Claims, 15 Drawing Sheets

(51) Int. Cl.
*H05H 1/46* (2006.01)
*H01J 37/32* (2006.01)

(52) U.S. Cl.
CPC .. *H01J 37/32357* (2013.01); *H01J 37/32669* (2013.01); *H05H 2001/4667* (2013.01)

(58) Field of Classification Search
CPC ........... H01J 37/32155; H01J 37/32165; H01J 37/32174; H01J 37/32183; H01J 37/3266; H01J 37/32669; H01J 37/32678; H01J 37/32688; H01J 37/345; H01J 37/3452; H01J 37/3455; H01J 37/3458; H01J 37/3461
USPC ...... 118/723 I, 723 IR, 723 AN; 156/345.48, 156/345.49; 315/111.51
See application file for complete search history.

(56) References Cited

U.S. PATENT DOCUMENTS

| | | | |
|---|---|---|---|
| 6,193,854 B1 * | 2/2001 | Lai et al. | 204/192.12 |
| 6,341,574 B1 * | 1/2002 | Bailey, III | H01J 37/3266 118/723 AN |
| 7,504,041 B2 * | 3/2009 | Chandrachood et al. | 216/68 |
| 7,713,432 B2 | 5/2010 | Johnson et al. | |
| 8,231,767 B2 | 7/2012 | Iori et al. | |
| 2004/0011467 A1 * | 1/2004 | Hemker et al. | 156/345.49 |
| 2006/0070703 A1 | 4/2006 | Johnson et al. | |
| 2007/0257009 A1 | 11/2007 | Chandrachood et al. | |
| 2009/0220865 A1 * | 9/2009 | Ouye | 430/5 |
| 2010/0294656 A1 | 11/2010 | Ikeda et al. | |
| 2011/0094995 A1 * | 4/2011 | Yamazawa et al. | 216/68 |

FOREIGN PATENT DOCUMENTS

| | | |
|---|---|---|
| JP | 11-340200 A | 12/1999 |
| JP | 2000-12294 A | 1/2000 |
| JP | 2002-18798 A | 1/2002 |
| JP | 2004-172243 A | 6/2004 |
| JP | 2008-516426 A | 5/2008 |
| JP | 2009-535852 A | 10/2009 |
| KR | 2002-0060969 A | 7/2002 |
| WO | 01/37315 A1 | 5/2001 |

OTHER PUBLICATIONS

International Preliminary Report on Patentability in PCT/JP2011/006459, with transmittal sheet, dated Jun. 13, 2013 (7 pages).
International Search Report in International Application No. PCT/JP2011/006459 (dated Feb. 14, 2012) (9 pages).

* cited by examiner 15.69    18.067

BEFORE CORRECTION

BEFORE CORRECTION 15.89          17.547

AFTER CORRECTION

AFTER CORRECTION

PLASMA TREATMENT APPARATUS

CROSS-REFERENCES TO RELATED APPLICATIONS

This application is a continuation application of International Application No. PCT/JP2011/006459, filed Nov. 21, 2011, which claims the benefit of Japanese Patent Application Nos. 2010-267321, filed Nov. 30, 2010 and 2011-192372, filed Sep. 5, 2011. The contents of the aforementioned applications are incorporated herein by reference in their entireties.

TECHNICAL FIELD

The present invention relates to a plasma treatment apparatus and, more particularly, to a plasma treatment apparatus suitable for a dry etching apparatus, a plasma CVD apparatus, a sputtering apparatus, or a surface modification apparatus.

BACKGROUND ART

Inductive coupled plasma (hereinafter called "ICP") capable of generating low-pressure, high-density plasma, and helicon wave plasma (hereinafter called "helicon") that generates plasma by causing excitation and propagation of helicon waves have heretofore been known as a plasma source of a plasma treatment apparatus for substrate treatment. Typically, the ICP generates plasma, utilizing an antenna to which radio-frequency power is applied. Typically, the helicon includes the same antenna as the ICP and is further configured in combination with a magnetic circuit so that helicon waves can propagate through plasma.

An example of a configuration of a conventional plasma treatment apparatus will be described with reference to FIG. 15 (Refer to PTL 1). The plasma treatment apparatus is configured with an ICP apparatus. The apparatus includes a substrate treatment chamber 101 that can be held under a reduced pressure therein, a substrate supporting mechanism 102 that supports a substrate 103 in the substrate treatment chamber 101, a gas introduction mechanism 104 that introduces a gas into the substrate treatment chamber 101, an annular antenna 105 for generating plasma in the substrate treatment chamber 101, a radio-frequency power supply 106 that supplies radio-frequency power to the antenna 105, and a matching circuit 107 for providing matching when the radio-frequency power supply 106 supplies the radio-frequency power to the antenna 105. The substrate treatment chamber 101 is formed of a non-metallic portion 101a such as quartz, and a metallic portion 101b made of aluminum or stainless steel or the like. Solenoid coils 108, 109 for diffusing a magnetic field are arranged around the antenna 105. Further, permanent magnets 110 are arranged around the substrate treatment chamber 101, as needed. The permanent magnets 110 are provided in order to suppress plasma losses on wall surfaces of the substrate treatment chamber 101. With the above configuration, direct-current power supplies 111, 112 supply direct-current power to the solenoid coils 108, 109, respectively, thereby to produce a magnetic field in the substrate treatment chamber 101, so that plasma generated in the non-metallic portion 101a of the substrate treatment chamber 101 can be diffused in the metallic portion 101b of the substrate treatment chamber. Incidentally, illustrations of an evacuation mechanism for holding the inside of the substrate treatment chamber 101 under the reduced pressure, a substrate transfer mechanism that transports the substrate 103, a substrate temperature control mechanism, a wall surface temperature control mechanism for the substrate treatment chamber 101, and a gas supply mechanism that feeds the gas to the gas introduction mechanism 104, and others are omitted from FIG. 15 for convenience of explanation.

Next, description will be given with regard to a procedure for substrate treatment using the above-described plasma treatment apparatus. The substrate 103 is transported into the substrate treatment chamber 101 by the substrate transfer mechanism (not shown), and the substrate 103 is fixed on the substrate supporting mechanism 102. A pressure in the substrate treatment chamber 101 is reduced to a predetermined pressure by the evacuation mechanism (not shown), and further, the gas fed from the gas supply mechanism (not shown) is introduced through the gas introduction mechanism 104 into the substrate treatment chamber 101, which is then held under the predetermined pressure. The radio-frequency power supply 106 applies a radio frequency to the antenna 105 through the matching circuit 107 thereby to generate plasma in the substrate treatment chamber 101, and the plasma is used to treat the substrate 103. Incidentally, for excitation of helicon waves, during the application of the radio frequency, the direct-current power supplies 111, 112 feed a direct current to the solenoid coils 108, 109 thereby to form a magnetic field in the substrate treatment chamber 101. At this time, typically, currents in opposite directions pass through the solenoid coils 108, 109.

Meanwhile, PTL 2 discloses an etching apparatus utilizing ECR (electron cyclotron resonance). FIG. 16 shows the ECR (electron cyclotron resonance) etching apparatus disclosed in PTL 2. An apparatus 310 is configured to supply microwaves 314 of 2.45 GHz through a quartz window 313 to an ionization chamber 311a provided in an upper portion of an apparatus body 311, and to induce electric discharge using external magnetic coils 312. Electrons reach a state of cyclotron resonance under the influence of a magnetic field produced by the microwaves 314 and the external magnetic coils 312. The excited electrons cause dissociation of an etching gas 315, thereby generating high-density plasma. Ions produced by electrolytic dissociation enter through a lead electrode 316 along the diverging magnetic field into a process chamber 311b provided in a lower portion of the apparatus body 311, thus enabling good directional (anisotropic) etching. Meanwhile, a supporting substrate 301 is mounted to a substrate holder 318 held at an oblique angle by a tilting stage 317 having any settable angle of tilt, and further, the supporting substrate 301 rotates on a rotating shaft 319 by a motor (not shown). The ECR (electron cyclotron resonance) etching apparatus shown in FIG. 16 forms a thin film of reverse tapered shape by further rotating the rotating shaft 319 with the supporting substrate 301 inclined 90°-α with respect to an ion beam 316a during etching.

CITATION LIST

Patent Literature

PTL 1: Japanese Patent Application Laid-Open No. 10-172790
PTL 2: Japanese Patent Application Laid-Open No. 2002-18798

SUMMARY OF INVENTION

Technical Problem

The above-described conventional plasma treatment apparatus disclosed in PTL 1 poses a problem as given below. A plasma density distribution for treatment of the substrate 103 can be controlled by changing a distribution of a magnetic field produced by changing current values of the solenoid coils 108, 109. However, the changes in the current values of the solenoid coils 108, 109 cause a concentric change in the distribution of the magnetic field and hence a concentric change also in the plasma density distribution, and therefore, if the center of the plasma density distribution deviates from the center of the substrate 103 to be treated, correction for the deviation is not possible with only the changes in the current values of the solenoid coils 108, 109. The occurrence of unevenness in the plasma density distribution in an etching apparatus, for example, results in unevenness in an etching rate distribution.

The deviation of the center of the plasma density distribution may be due to the problem of non-uniformity in plasma generation caused by the shape of the antenna 105, a method for applying radio-frequency power, the accuracy of mounting of the antenna 105 to a container, a gas flow depending on the positions of gas introduction and evacuation systems, or the like, or the problem of non-uniformity in plasma diffusion caused by the part or mounting accuracy of the solenoid coils 108, 109 or the permanent magnets 110.

Meanwhile, the above-described conventional ECR (electron cyclotron resonance) etching apparatus disclosed in PTL 2 can improve an asymmetric etching distribution by tilting the substrate 301; however, plasma in itself remains non-uniform, and therefore, it is expected that non-uniformity in the plasma may cause charge-up damage or the like to the substrate 301.

An object of the present invention is to solve the foregoing problems, and to provide a plasma treatment apparatus capable of achieving uniform substrate treatment by controlling an uneven distribution of plasma in itself and correcting unevenness in a plasma density distribution.

Solution to Problem

In order to attain the above object, a plasma treatment apparatus according to the present invention is configured as given below.

In order to attain the above object, according to a first aspect of the present invention, there is provided a plasma treatment apparatus for treating a substrate with plasma, including: a container capable of placement of the substrate therein; an antenna provided around a periphery of the container so as to generate the plasma in the container; magnetic field generating means provided around a periphery of the antenna so as to generate a magnetic field in the container and thereby diffuse the plasma; and inclination adjustment means for inclining at least any one of the antenna and the magnetic field generating means.

According to the first aspect, at least any one of the magnetic field generating means and the antenna can be inclined by the inclination adjustment means. Thereby, when unevenness in a plasma treatment distribution is found in advance by performing substrate treatment, the inclination of the magnetic field generating means or the antenna is changed so that the center of the plasma is oriented in a direction in which a process works at a slow rate, thereby to effect a change in the inclination of the magnetic field produced by the magnetic field generating means or the distribution of the plasma generated by the antenna. This enables correcting unevenness in a plasma density distribution, thereby achieving uniform substrate treatment.

In order to attain the above object, according to a second aspect of the present invention, there is provided the plasma treatment apparatus according to the first aspect, wherein the antenna is an annular antenna configured to be substantially axisymmetric about a first axis and surround the first axis, the magnetic field generating means is a solenoid coil configured to be substantially axisymmetric about a second axis and surround the second axis, and at least any one of the annular antenna and the solenoid coil is inclined by the inclination adjustment means such that the first axis and the second axis form a predetermined angle with each other.

Also, in order to attain the above object, according to a third aspect of the present invention, there is provided the plasma treatment apparatus according to the first aspect, further including a base plate that supports the magnetic field generating means, wherein the inclination adjustment means is a plate-shaped member provided between the magnetic field generating means and the base plate.

According to the third aspect, a height of the magnetic field generating means on one side thereof can be different from a height thereof on the other side by adjusting a thickness of the plate-shaped member provided between the magnetic field generating means and the base plate. Thereby, the magnetic field generating means can be inclined at a predetermined angle with respect to a center line of the antenna.

Also, in order to attain the above object, according to a fourth aspect of the present invention, there is provided the plasma treatment apparatus according to the first aspect, further including a base plate that supports the magnetic field generating means, wherein the inclination adjustment means is a drive unit being connected to the base plate and capable of up and down movement, and the magnetic field generating means is inclined by inclining the base plate by the up and down movement of the drive unit.

According to the fourth aspect, the drive unit is moved up and down thereby to enable continuous changes in the height of the magnetic field generating means on the one side thereof and the height thereof on the other side. Thereby, the magnetic field generating means can be inclined at the predetermined angle with respect to the center line of the antenna.

Also, in order to attain the above object, according to a fifth aspect of the present invention, there is provided the plasma treatment apparatus according to the fourth aspect, wherein the base plate has substantially an annular shape surrounding the container, and the drive unit includes a first drive unit provided on one end side of the base plate, and a second drive unit provided on the other end side of the base plate.

According to the fifth aspect, the drive unit can incline the base plate on each of the one and other end sides thereof at the predetermined angle with respect to the center line of the antenna.

Also, in order to attain the above object, according to a sixth aspect of the present invention, there is provided the plasma treatment apparatus according to the fourth aspect, wherein the base plate has substantially an annular shape surrounding the container, and the drive unit includes a first drive unit, a second drive unit and a third drive unit arranged equiangularly in a circumferential direction of the base plate.

According to the sixth aspect, the first drive unit, the second drive unit and the third drive unit are each periodically moved up and down thereby to enable rendering variable, at certain periods, a height position of the magnetic field generating means corresponding to the first drive unit, a height position of the magnetic field generating means corresponding to the second drive unit, and a height position of the magnetic field generating means corresponding to the third drive unit. Thereby, during substrate treatment, the inclination of the magnetic field generating means is changed at certain periods. Thereby, a center line of the magnetic field generating means makes a gyrating movement around the center line of the antenna, while keeping a certain angle of inclination, and thus, the magnetic field produced by the magnetic field generating means can likewise make a gyrating movement in an offset position with respect to the center of the substrate. The center of the magnetic field generating means, that is, the center of the magnetic field, makes a gyrating movement in an offset position from the center of the antenna thereby to enable more uniform treatment for a substrate having a large area, as compared to when the center of the magnetic field generating means, that is, the center of the magnetic field, coincides with the center of the antenna. Also, a rate of movement is changed for adaptation to the plasma density distribution, that is, a substrate processing rate distribution, thereby to effect a slow movement in a region where the processing rate is slow, or a fast movement in a region where the processing rate is fast, thus enabling correction of unevenness.

Also, in order to attain the above object, according to a seventh aspect of the present invention, there is provided the plasma treatment apparatus according to the second aspect, wherein the angle formed by the first axis and the second axis lies between 0° and 5°.

According to the seventh aspect, the angle of inclination of the magnetic field generating means with respect to the antenna is represented as the angle formed by the center line of the magnetic field generating means as the axis of symmetry of the magnetic field generating means and the antenna center line as the axis of symmetry of the antenna. Although diffusion of the magnetic field produced by the magnetic field generating means is affected by the influence of the shape of the container or the strength of the magnetic field produced, an angle of 0° to 5° is suitable for inclination of the magnetic field generating means for effective substrate treatment. When the magnetic field generating means is inclined at a greater angle, there arises the problem of causing interference with other components such as the antenna.

Also, in order to attain the above object, according to an eighth aspect of the present invention, there is provided the plasma treatment apparatus according to the first aspect, wherein the magnetic field generating means includes a first solenoid coil and a second solenoid coil concentrically arranged, and the inclination adjustment means is provided for each of the first solenoid coil and the second solenoid coil.

According to the eighth aspect, the inclination adjustment means is provided for each of the first solenoid coil and the second solenoid coil thereby to enable independent adjustment of the inclination of each of the solenoid coils, thus enabling finer correction of the distribution.

Also, in order to attain the above object, according to a ninth aspect of the present invention, there is provided the plasma treatment apparatus according to the first aspect, wherein the container includes a power supply container to generate the plasma therein, and a process container being capable of placement of the substrate therein and connected to the power supply container such that an internal space of the process container communicates with an internal space of the power supply container.

Advantageous Effects of Invention

As is apparent from the above description, according to the present invention, the inclination adjustment means such that any one of the coil center line as the axis of symmetry of the solenoid coils and the antenna center line as the axis of symmetry of the annular antenna is inclined at a predetermined angle relatively to the other center line is mounted to the solenoid coils thereby to adjust the inclination of the magnetic field produced by the solenoid coils for substrate treatment, thus enabling correction of unevenness in the plasma density distribution and hence uniform substrate treatment.

Also, the drive unit capable of up and down movement is used as the inclination adjustment means thereby to enable changing the inclination of the solenoid coils with respect to the annular antenna. Thus, substrate treatment takes place while changing continuously the inclination of the magnetic field produced by the solenoid coils by changing the inclination of the solenoid coils during the substrate treatment. This enables correcting unevenness in the plasma density distribution, thus achieving uniform substrate treatment.

Also, the inclination adjustment means is provided for each of the first solenoid coil and the second solenoid coil thereby to enable independent adjustment of the inclination of each of the solenoid coils, thus enabling finer correction of the distribution.

DESCRIPTION OF EMBODIMENTS

Preferred embodiments of the present invention will be described below with reference to the accompanying drawings.

Figure 1:
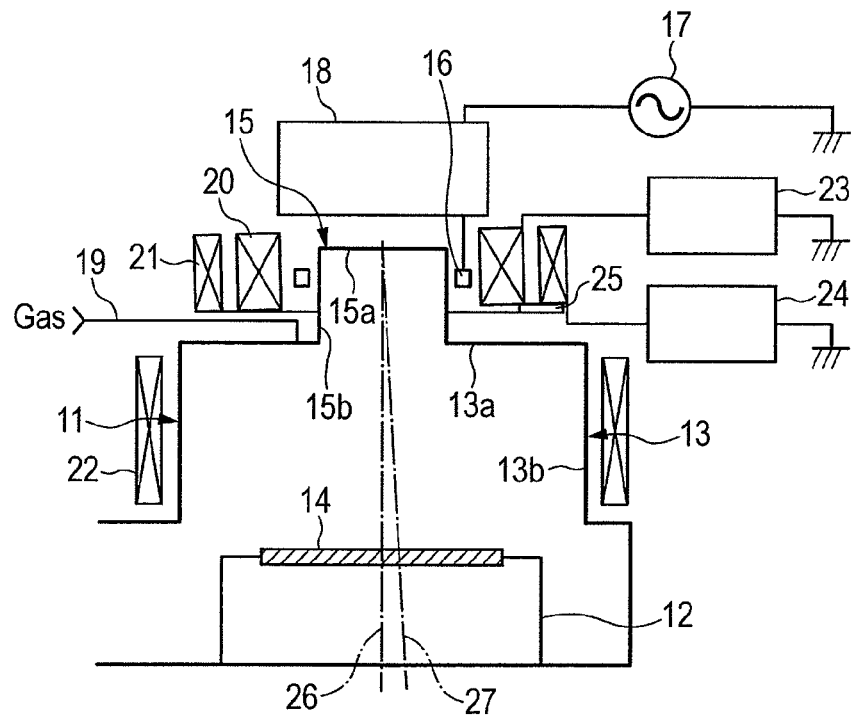
FIG. 1 is a diagram showing an internal structure of an evacuated container of a plasma treatment apparatus for substrate treatment according to an embodiment of the present invention, and configurations of related portions.
Figure 2A:
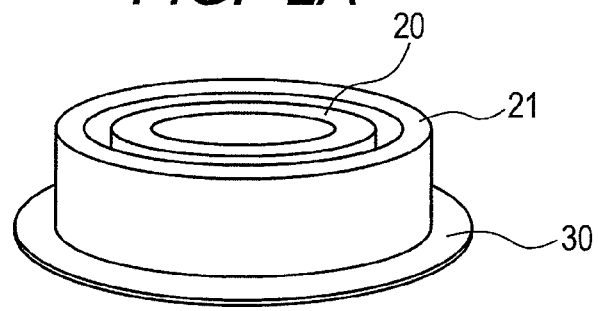
FIG. 2A is a view showing solenoid coils according to the embodiment of the present invention as mounted to a base plate.
Figure 2B:
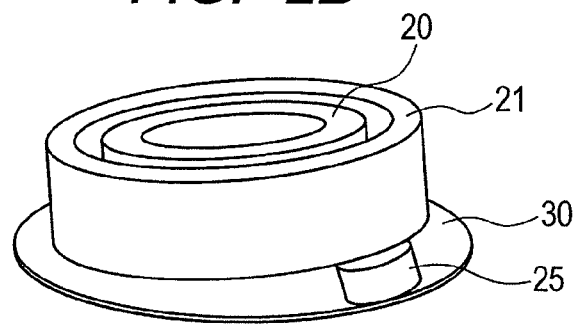
FIG. 2B is a view showing the solenoid coils according to the embodiment of the present invention as inclined with a plate-shaped member inserted between the solenoid coils and the base plate.
Figure 3:
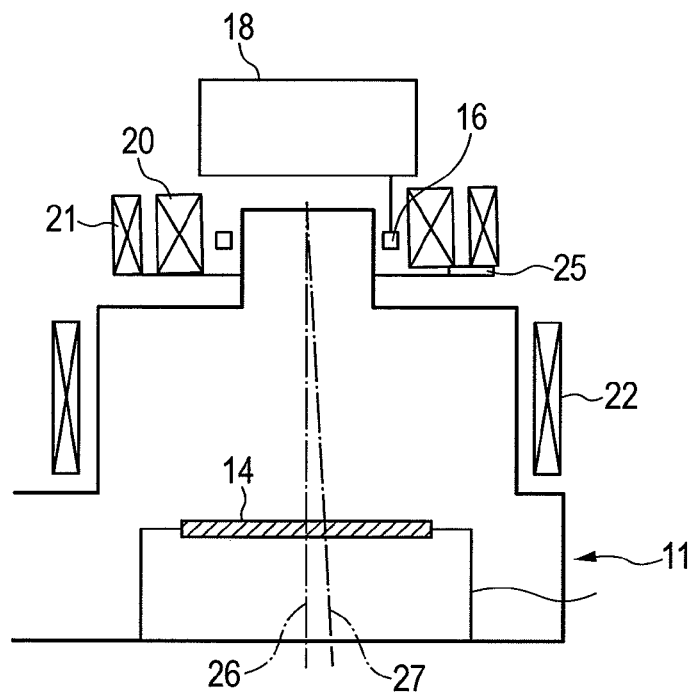
FIG. 3 is a diagram of assistance in explaining the state of inclination of the solenoid coils according to the embodiment of the present invention.

A first embodiment will be described with reference to FIGS. 1 to 4D. FIG. 1 is a diagram showing an internal structure of an evacuated container of a plasma treatment apparatus for substrate treatment, and configurations of related portions. FIG. 2A is a view showing solenoid coils as mounted to a base plate. FIG. 2B is a view showing the solenoid coils as inclined with a plate-shaped member inserted between the solenoid coils and the base plate. FIG. 3 is a diagram of assistance in explaining the state of inclination of the solenoid coils. FIGS. 4A, 4B, 4C and 4D are representations of etching distribution characteristics.

In FIG. 1, the plasma treatment apparatus is shown as being of an ICP-related apparatus configuration and a helicon-related apparatus configuration. A container 11 is held under a predetermined reduced pressure in its internal space by an evacuation mechanism (not shown). The container 11 will be hereinafter called an "evacuated container." In the evacuated container 11 according to the embodiment, the internal space is formed of two spaces. One of the spaces is the space in which a substrate supporting mechanism 12 is arranged, and is formed by a process container 13 made of metal such as aluminum or stainless steel. A sidewall of the process container 13 is formed in a cylindrical shape, for example. Also, a substrate 14 to be treated is placed on the substrate supporting mechanism 12. The substrate 14 is the large-sized substrate having a diameter φ of 300 mm, for example. The other space is the space in which plasma is generated, and is formed by a power supply container 15 made mainly of a dielectric material such as quartz, into which radio frequencies can be introduced. The power supply container 15 may also be configured such that an upper end wall 15a is made of metal and other sidewall portions are made of a dielectric material. A sidewall 15b of the power supply container 15 located on the upper side is formed in substantially a cylindrical shape, for example. The power supply container 15 is mounted and fixed to an upper wall 13a of the process container 13. A diameter of the sidewall 15b of the power supply container 15 is set smaller relative to a diameter of a sidewall 13b of the process container 13. An internal space of the process container 13 communicates with an internal space of the power supply container 15. Therefore, plasma generated in the internal space of the power supply container 15 diffuses and moves downward into the internal space of the process container 13. The substrate 14 placed in the internal space of the process container 13 is located facing the internal space of the power supply container 15. A central axis of the cylindrical sidewall of the power supply container 15, and a substrate center line that passes through the center of the substrate 14 and is perpendicular to the substrate are coaxially located. The plasma diffusing from the power supply container 15 into the process container 13 moves to space on a front face of the substrate 14. Incidentally, herein, when the power supply container 15 has a square shape, a point of intersection of diagonal lines is taken as a central axis.

In the configuration of the embodiment, an edge portion of a lower portion of the power supply container 15 is flush with the upper wall 13a of the process container 13. A portion whose diameter increases gradually in the shape of a trumpet in a direction from the cylindrical sidewall 15b of the power supply container 15 to the process container 13 may also be formed in a portion of the power supply container 15 in a boundary portion between the process container 13 and the power supply container 15 in connected relation.

An antenna 16 is arranged around an outer periphery of the power supply container 15. The antenna 16 has an annular shape opened in a portion, and is connected at one side to a matching circuit 18 for providing matching at the time of supply of radio-frequency power, and at the other side to a ground potential, and its annular portion is spaced away from the power supply container 15 with a certain space in between and is arranged parallel to the upper wall of the process container 13. A well-known mechanism is used as a supporting mechanism for the antenna 16, although not shown in the drawing.

The above-described configuration is provided with a radio-frequency power supply 17 that supplies radio-frequency power to the antenna 16, the matching circuit for providing matching when the radio-frequency power supply 17 supplies the radio-frequency power to the antenna 16, a gas introduction mechanism 19 that introduces a gas into the internal space of the process container 13, concentric solenoid coils 20, 21 (magnetic field generating means) arranged around the antenna 16, and permanent magnets 22 arranged around the process container 13. The solenoid coils 20, 21 serve to diffuse a magnetic field, and are supplied with direct-current power by direct-current power supplies 23, 24, respectively. The permanent magnets 22 are provided in order to suppress plasma losses on wall surfaces of the process container 13. Incidentally, illustrations of the evacuation mechanism that holds the inside under a reduced pressure, a substrate transfer mechanism, a substrate temperature control mechanism, a wall surface temperature control mechanism for the process container, and a gas supply mechanism that feeds the gas to the gas introduction mechanism, and others are omitted from FIG. 1 because of having no direct relation to the subject matter of the invention and for convenience of explanation. A center line 26 of the antenna 16 is located coaxially of the axis of the cylindrical sidewall of the power supply container 15, and the substrate center line that passes through the center of the substrate 14 and is perpendicular to the substrate. Incidentally, the solenoid coils 20, 21 are substantially axisymmetric about a center line 27 (sometimes called the coil center line 27), and the antenna 16 is configured to be substantially axisymmetric about the center line 26 (sometimes called the antenna center line 26).

Next, description will be given with regard to an inclination adjustment mechanism as a feature characteristic of the present invention. FIG. 2A shows the first solenoid coil 20 and the second solenoid coil 21 as fixed to a base plate 30. In FIG. 2A, the center line of the first and second solenoid coils 20, 21 and the center line of the antenna 16 shown in FIG. 1 coincide mechanically with each other. A first feature of the present invention is that, as shown in FIG. 2B, an inclination adjustment means (e.g. a plate-shaped member) 25 is provided between one end side of the first and second solenoid coils 20, 21 (e.g. the right-hand side of FIG. 1) and the base plate 30, so that the center line 27 of the solenoid coils is inclined at a predetermined angle with respect to the center line 26 of the antenna 16. FIG. 2B shows an example in which a shim is inserted as the inclination adjustment means (e.g. the plate-shaped member) 25. As shown in FIG. 2B, the shim 25 is inserted between the one end side of the first and second solenoid coils 20, 21 (e.g. the right-hand side of FIG. 2B) and the base plate 30, and thereby, as shown in FIG. 1, the center line 27 of the solenoid coils 20, 21 is inclined at the predetermined angle with respect to the center line 26 of the antenna 16. Preferably, the angle of inclination lies between 0° and 5°. Incidentally, "the angle of inclination of the solenoid coils with respect to the antenna" as employed herein refers to the angle formed by the coil center line 27 as the axis of symmetry of the solenoid coils 20, 21 and the antenna center line 26 as the axis of symmetry of the annular antenna 16.

In the above-described plasma treatment apparatus, the substrate 14 is transported into the process container by the substrate transfer mechanism, and the substrate 14 is placed and fixed on the substrate supporting mechanism 12. FIG. 1 shows the substrate 14 as fixed. Then, the process container 13 and the power supply container 15 are evacuated to a required pressure by the evacuation mechanism, and a gas fed from a gas supply system is introduced through the gas introduction mechanism 19 into the process container 13, which is then held under the required pressure therein. The radio-frequency power supply 17 applies a radio frequency to the antenna 16 through the matching circuit 18 thereby to generate plasma in the power supply container 15, and in a region in the process container 13 in the vicinity of the power supply container 15. The plasma generated in the power supply container 15 and the like diffuses along a magnetic field produced by the solenoid coils 20, 21 into the internal space of the process container 13. The plasma thus diffused is used to treat the substrate 14.

Next, description will be given with reference to FIG. 3 with regard to inclination adjustment of the solenoid coils 20, 21. The solenoid coils 20, 21 are fixed to the base plate 30 shown in FIG. 2A and, further, to the process container 13. FIG. 3 shows the state of the solenoid coils after the inclination adjustment. The solenoid coils 20, 21 may be inclined in any of three possible ways; that is, the inside solenoid coil 20 and the outside solenoid coil 21 are independently inclined, both the inside solenoid coil 20 and the outside solenoid coil 21 are inclined at the same time, or any one of the inside solenoid coil 20 and the outside solenoid coil 21 is inclined. How the inside solenoid coil 20 and the outside solenoid coil 21 are actually inclined is determined based on a result of an etching rate distribution of the substrate before the inclination adjustment. FIG. 3 shows an instance where both the inside solenoid coil 20 and the outside solenoid coil 21 are inclined at the same time. Also, in this example, the shim is inserted thereby to adjust the inclination; however, the inclination adjustment means is not limited to the shim.

In FIG. 3, the angle formed by the antenna center line 26 and the coil center line 27 is taken as the angle of inclination. When the inclination adjustment of the solenoid coils is not initially performed, the antenna center line 26 and the coil center line 27 are in a coincident position. In other words, under a condition where the solenoid coils 20, 21 are fixed to the base plate as shown in FIG. 2A, the antenna center line 26 and the coil center line 27 coincide with each other. However, as shown in FIG. 2B, the shim 25 having a thickness corresponding to a desired angle of inclination is inserted in a desired direction of inclination between the solenoid coils 20, 21 and the base plate 30, and the antenna center line 26 and the coil center line 27 move farther away from each other as the angle of inclination becomes larger. The magnetic field produced by the solenoid coils 20, 21 and the plasma diffused by the magnetic field also move in the same direction as above described.

Next, description will be given with regard to a procedure for improving an etching rate distribution on a process substrate, taking an etching apparatus as an example. First, under a condition before the inclination adjustment of the solenoid coils, the substrate is subjected to etching, and is examined for the state of the etching rate distribution. Incidentally, an optical film thickness measurement instrument is used for measurement of the etching rate distribution. Then, the position, thickness, size and shape of the shim 25 to be inserted between the base plate 30 and the solenoid coils 20, 21 are determined for adaptation to the desired direction of inclination of the solenoid coils and the desired amount of the angle of inclination thereof, based on measured results of the etching rate distribution of the process substrate 14. Then, the shim 25 is inserted to perform the actual inclination adjustment of the solenoid coils. Under this condition, the substrate is subjected again to etching, and is examined for the state of the etching rate distribution. When corrected results are adequate, operation is brought to an end, or, when the results are inadequate, the above operation is repeated again.

Figure 4A:
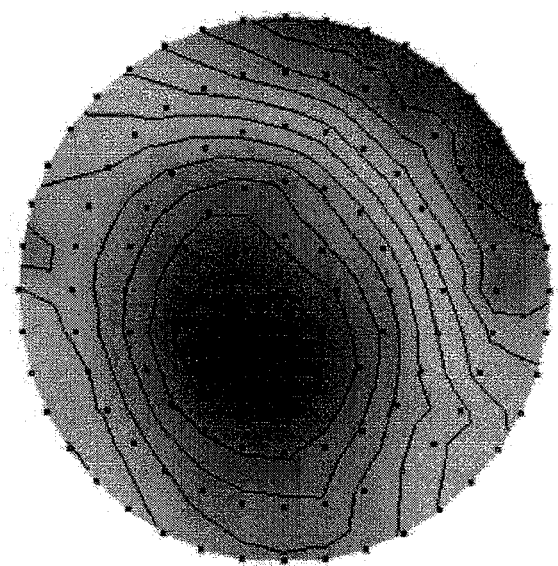
FIG. 4A is a representation of etching distribution characteristics before adjustment of the inclination of the solenoid coils.
Figure 4B:
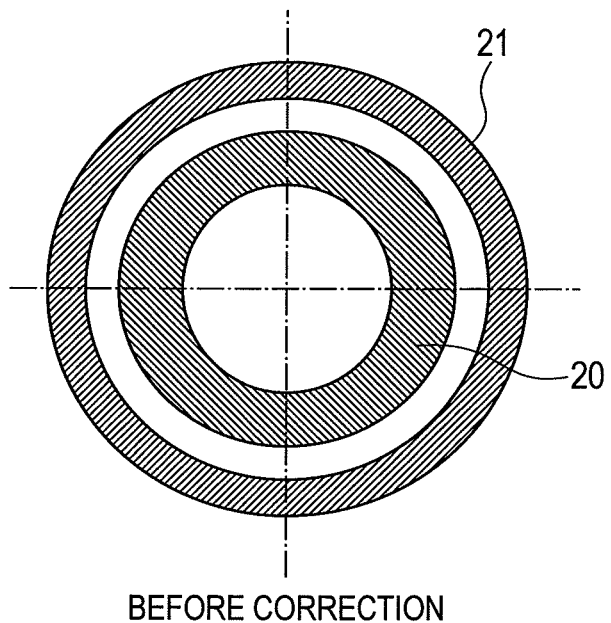
FIG. 4B is a view showing the state of the solenoid coils before the adjustment of the inclination of the solenoid coils.
Figure 4C:
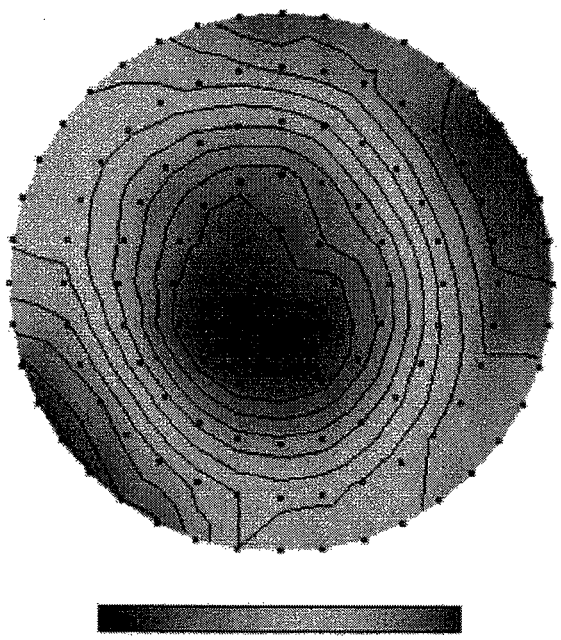
FIG. 4C is a representation of the etching distribution characteristics after the adjustment of the inclination of the solenoid coils.
Figure 4D:
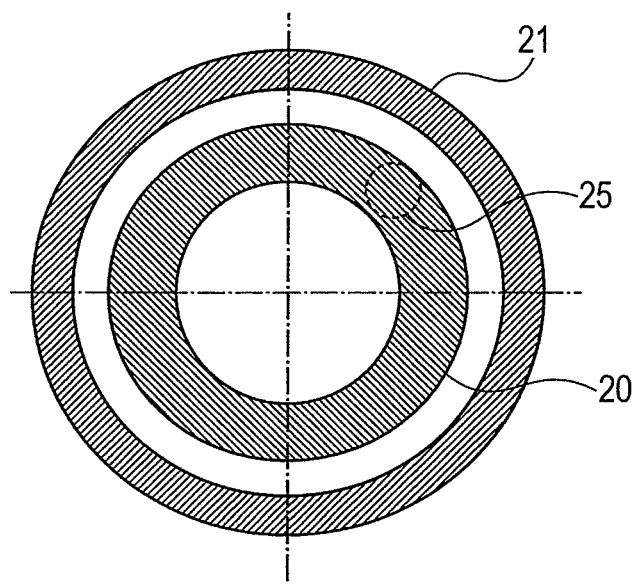
FIG. 4D is a view showing the state of the solenoid coils after the adjustment of the inclination of the solenoid coils.

FIG. 4A shows a distribution of etching process rate of a process substrate of 300 mm diameter before the inclination adjustment of the solenoid coils. FIG. 4B shows the state of the solenoid coils corresponding to FIG. 4A. FIG. 4C shows the distribution of etching process rate of the process substrate of 300 mm diameter after the inclination adjustment of the solenoid coils. FIG. 4D shows the state of the solenoid coils corresponding to FIG. 4C. The process substrate is a silicon wafer of 300 mm diameter having an oxide film formed on the surface. FIGS. 4A and 4C show representations on contour plans of results obtained by making measurements on the substrate surface at 121 predetermined points to determine film thicknesses before and after the process, and calculating the etching process rate from a difference in film thickness (the amount of etching away). The etching process rate is obtained by (an initial film thickness the film thickness after the process)/etching time, and also, the value of the etching rate distribution is expressed as $3\sigma\%$ represented by Equation (1), based on a standard deviation and a mean value of the etching process rate at each point.

$$3\sigma\% = (3 \times \text{the standard deviation}/\text{the mean value}) \times 100 \quad (1)$$

In an example shown in FIGS. 4A to 4D, a current is fed only through the inside solenoid coil 20, or the first solenoid coil 20, of the solenoid coils 20, 21. In FIGS. 4A and 4B, the shim 25 is not inserted in the solenoid coils 20, 21. In this case, substrate treatment generally tends to work at a fast rate at the upper right and at a slow rate at the lower left, and the center of the distribution shows a tendency to deviate slightly to the lower left. As a result of this, the value of the distribution of the etching process rate over the entire surface of the process substrate is 11%. In other words, it can be seen from FIG. 4A that an outer peripheral portion of the substrate at the upper right thereof has a portion in which the processing rate is extremely slow, which in turn leads to poor distribution as a whole.

FIGS. 4C and 4D show the distribution after the adjustment of the solenoid coils. The center of the distribution moves slightly to the upper right, based on the result of FIG. 4A. FIGS. 4C and 4D show results obtained by performing the inclination adjustment by inserting the shim 25 in the inside solenoid coil 20 in a direction corresponding to the upper right part of FIG. 4B so that the coil center line 27 moves in the above-described direction. FIG. 4D is a view showing the shim 25 as inserted in the solenoid coil 20. In this example, the inside solenoid coil 20 is adjusted by inserting the shim of 3.3 mm thick in the inside solenoid coil 20; however, the outside solenoid coil or both the inside and outside solenoid coils may be adjusted. Incidentally, the insertion of the shim of 3.3 mm thick corresponds to an inclination of 5° of the coils. As a result of the adjustment, the value of the distribution of the etching process rate over the entire surface of the process substrate is 7%. As is apparent from the result of the distribution, the distribution of the etching process rate can be improved and rendered more even by adjusting the distribution of the magnetic field by adjusting the inclination of the solenoid coils.

Figure 5A:
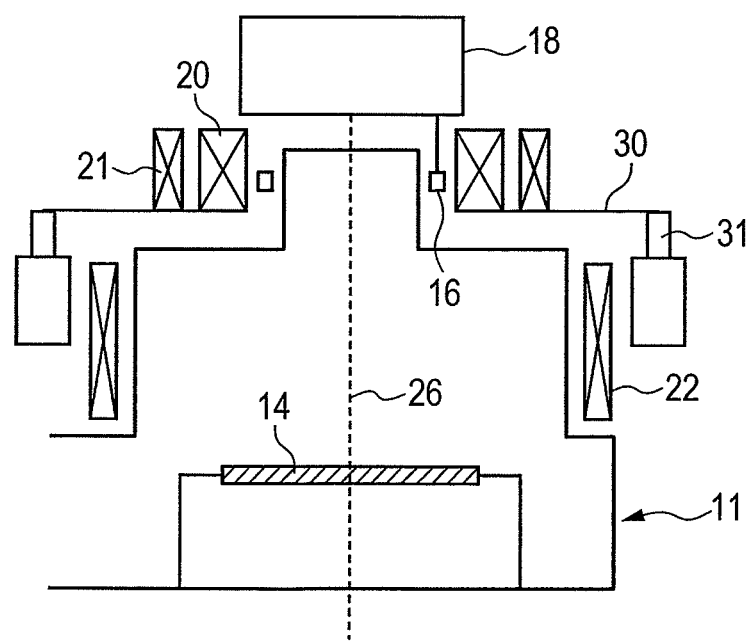
FIG. 5A is a diagram showing a layout of a single-shaft drive unit according to an embodiment of the present invention.
Figure 5B:
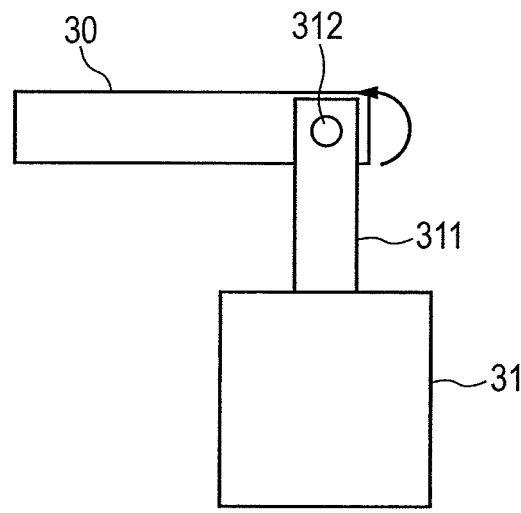
FIG. 5B is a view showing the single-shaft drive unit according to the embodiment of the present invention.

FIGS. 5A and 5B show a second embodiment. A basic configuration is the same as that of the first embodiment and, therefore, description of the basic configuration will be omitted, and description will be given with regard to a variable mechanism for the solenoid coils. The second embodiment is significantly different in that a drive unit 31 capable of up and down movement is used as the inclination adjustment means 25. In the second embodiment, as shown in FIG. 5A, the solenoid coils 20, 21 are linked at one end side (e.g. the right-hand side of FIG. 5A) and at the other end side (e.g. the left-hand side of FIG. 5A) via the base plate 30 to the single-shaft drive unit 31 capable of up and down movement. As shown in FIG. 5B, a rotating shaft 312 is rotatably provided on one end of the base plate 30 and on one end of a drive rod 311 of the drive unit 31 thereby to form a linkage structure. Preferably, a generally well-known mechanism such as performs position control by a combination of a ball screw and a servomotor is used as the single-shaft drive unit. In the second embodiment shown in FIG. 5A, the drive unit 31 effects upward and downward movements of the height positions of the solenoid coils 20, 21 on the one end side thereof (e.g. the right-hand side of FIG. 5A) and on the other end side (e.g. the left-hand side of FIG. 5A), and thereby, the coil center line 27 is freely inclinable with respect to the center line 26 of the substrate 14. Therefore, when even the actual inclination of the solenoid coils 20, 21 results in an insufficient improvement in the etching distribution, the drive unit 31 is moved up and down thereby to enable effecting a further change in the angle of inclination and thus achieving an improvement in efficiency in operation, as distinct from the above-described first embodiment. Also, when unevenness in the plasma varies depending on processing conditions, the drive unit may be controlled for adaptation to the processing conditions thereby to incline the solenoid coils at a predetermined angle.

Figure 6A:
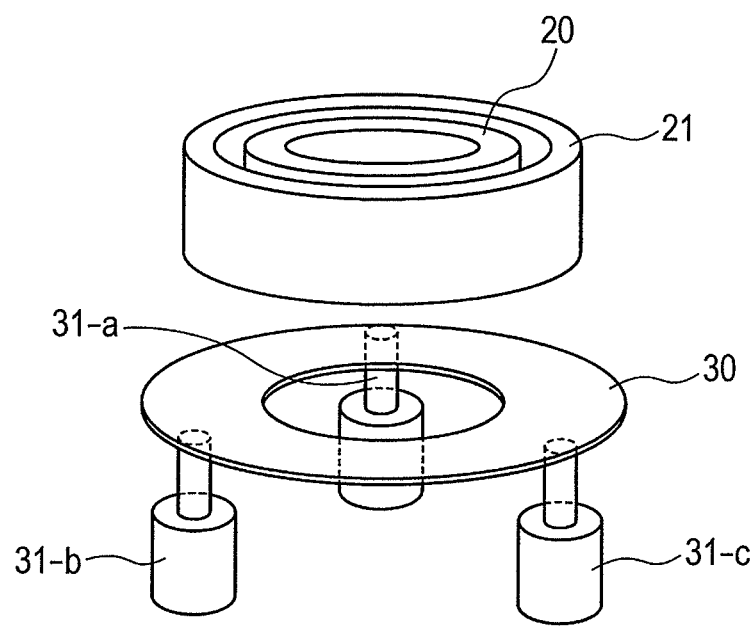
FIG. 6A is a view showing the solenoid coils as inclined by the single-shaft drive unit according to the embodiment of the present invention.
Figure 6B:
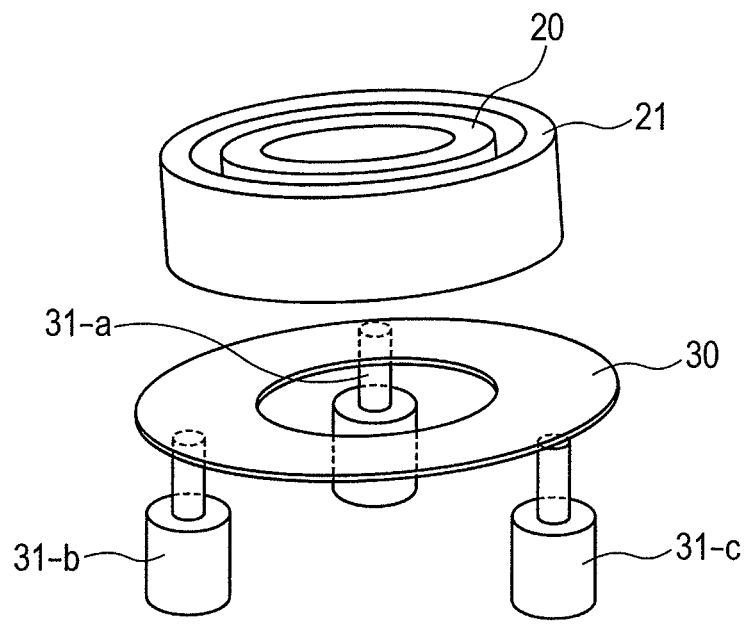
FIG. 6B is a view showing the solenoid coils as inclined by the single-shaft drive unit according to the embodiment of the present invention.

FIG. 6A is a view showing a layout of the single-shaft drive unit 31. As shown in FIG. 6A, the drive unit 31 is made up of a first drive unit 31-*a*, a second drive unit 31-*b* and a third drive unit 31-*c* arranged equiangularly (e.g. at 120° intervals) in a circumferential direction of the disc-shaped base plate 30. The three single-shaft units 31-*a*, 31-*b* and 31-*c* each have a linkage structure that is rotatable on a horizontal surface of the base plate 30. The linkage structure of each linkage portion is the same as that shown in FIG. 5B. Desirably, the three units are arranged at equally spaced intervals in order to control the inclination of the solenoid coils with efficiency. The single-shaft units 31-*a*, 31-*b* and 31-*c* are programmed so as to move in synchronization with one another by a controller (not shown). FIG. 6B shows the solenoid coils 20, 21 as inclined 5° to the right by an upward movement of the third drive unit 31-*c* and a downward movement of the first drive unit 31-*a* and the second drive unit 31-*b*. As shown in FIG. 6B, the three single-shaft units 31-*a*, 31-*b* and 31-*c* are moved in synchronization with one another thereby to enable rendering variable, at certain periods, the height position of the solenoid coils corresponding to the first drive unit 31-*a*, the height position of the solenoid coils corresponding to the second drive unit 31-*b*, and the height position of the solenoid coils corresponding to the third drive unit 31-*c*. Thereby, during substrate treatment, the inclination of the solenoid coils can be changed at certain periods. Thereby, the coil center line 27 makes a gyrating movement around the substrate center line 26, while keeping a certain angle of inclination, and thus, the magnetic field produced by the solenoid coils can likewise make a gyrating movement in an offset position with respect to the center of the substrate. The center of the solenoid coils, that is, the center of the magnetic field, makes a gyrating movement in an offset position from the center of the substrate thereby to enable more uniform treatment for a substrate having a large area, as compared to when the center of the solenoid coils, that is, the center of the magnetic field, coincides with the center of the substrate. Also, a rate of movement is changed for adaptation to the distribution thereby to effect a slow movement in a region where the processing rate is slow, or a fast movement in a region where the processing rate is fast, thus enabling correction of unevenness.

Figure 7A:
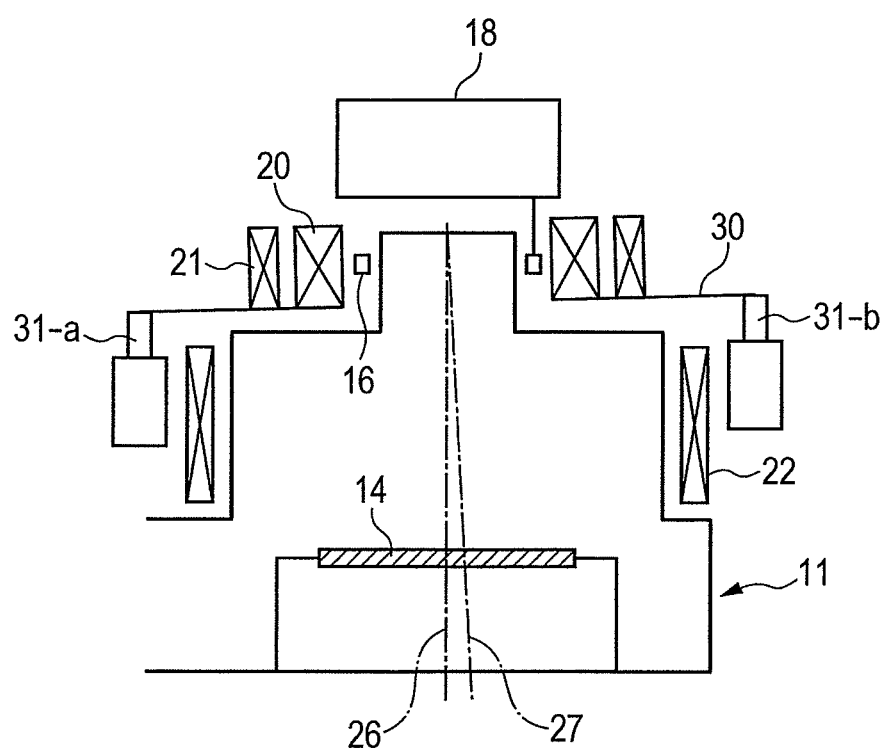
FIG. 7A is a diagram showing the solenoid coils as inclined by driving the single-shaft drive unit according to the embodiment of the present invention.
Figure 7B:
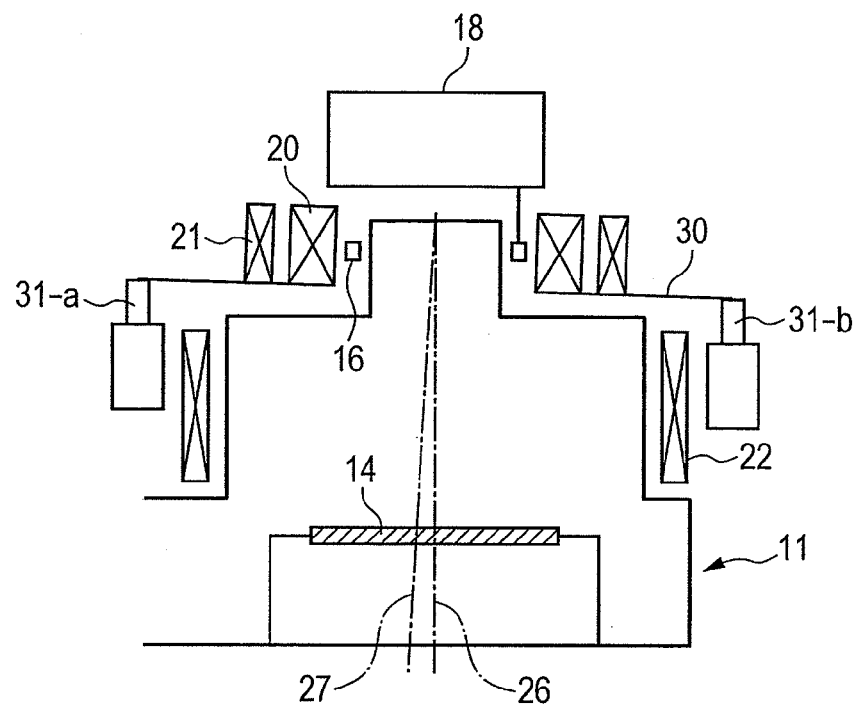
FIG. 7B is a view showing the solenoid coils as inclined by driving the single-shaft drive unit according to the embodiment of the present invention.

Next, description will be given with reference to FIGS. 7A and 7B with regard to the solenoid coils as inclined by driving the single-shaft drive unit 31. In FIG. 7A, the single-shaft unit 31-*a* on the left-hand side of the drawing is in a contracted position (in a down position), while the single-shaft unit 31-*b* on the right-hand side is in an extended position (in an up position). As a result of this, the solenoid coils are in a position inclined to the left. Meanwhile, in FIG. 7B, the single-shaft unit 31-*a* on the left-hand side of the drawing is in an extended position (in an up position), while the single-shaft unit 31-*b* on the right-hand side is in a contracted position (in a down position). As a result of this, the solenoid coils are in a position inclined to the right. The left and right single-shaft units are extended and contracted in synchronization with each other thereby to enable effecting a gradual change from left to right in the inclination of the solenoid coils.

Actually, the three single-shaft units are extended and contracted in synchronization with one another. Each of the single-shaft units is operated at certain periodic intervals, and thereby, the center of the solenoid coils moves in a certain conical orbit around a central axis of the substrate. During substrate treatment, this periodic operation is continued thereby to enable continuous irradiation of the substrate with plasma offset from the center of the substrate by the amount of inclination of the center of the solenoid coils.

A plasma density distribution tends to show a sharp decrease on the outer periphery of the substrate. As is the case with the second embodiment, a central axis of the solenoid coils, that is, the center of the magnetic field, moves in a conical form thereby to achieve the advantageous effect of enabling uniform plasma treatment for a substrate having a larger area. Also, a rate of movement is changed for adaptation to the distribution thereby to effect a slow movement in a region where the processing rate is slow, or a fast movement in a region where the processing rate is fast, thus enabling correction of unevenness.

Next, description will be given with regard to a third embodiment in which independent inclination adjustments are performed on the inside solenoid coil 20 and the outside solenoid coil 21.

Figure 12:
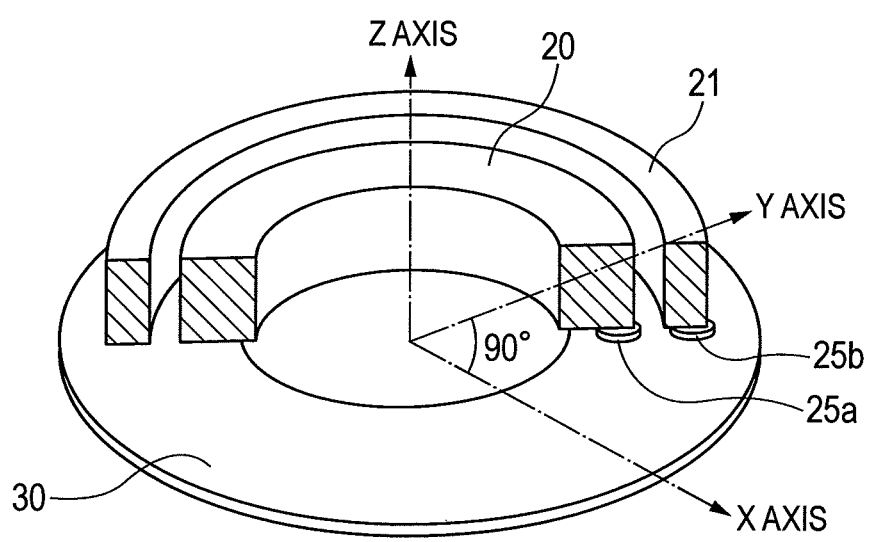
FIG. 12 is a view showing the solenoid coils according to an embodiment of the present invention as inclined with plate-shaped members inserted between the solenoid coils and the base plate.
Figure 13:
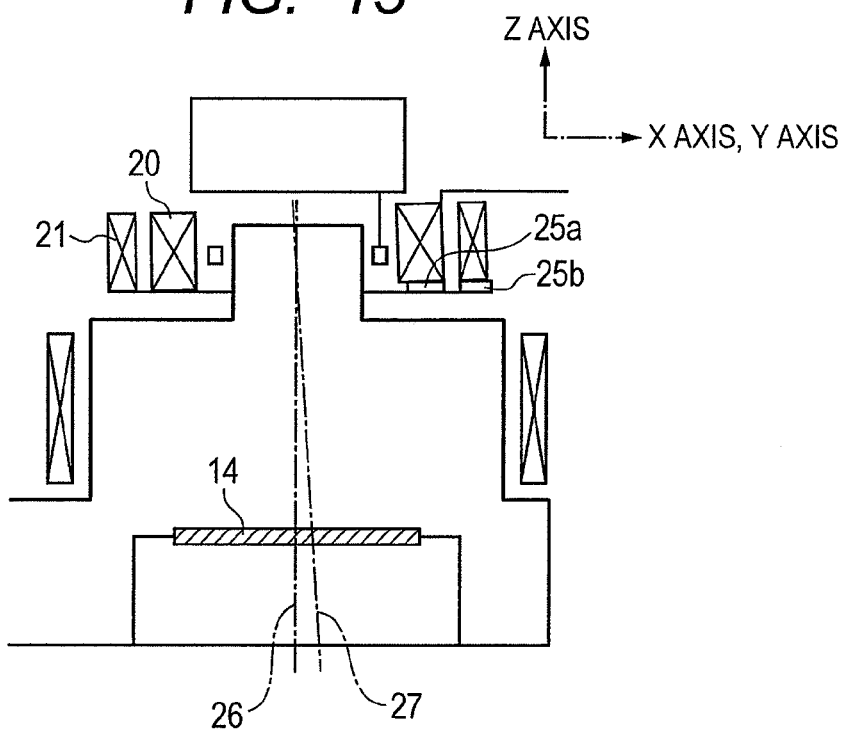
FIG. 13 is a diagram of assistance in explaining the state of inclination of the solenoid coils according to the embodiment of the present invention.

FIGS. 12 and 13 are views showing the inside solenoid coil 20 and the outside solenoid coil 21 as independently inclined. To incline independently the inside solenoid coil 20 and the outside solenoid coil 21, shims 25*a*, 25*b* having thicknesses corresponding to desired angles of inclination are inserted in desired directions of inclination between the solenoid coils 20, 21 and the base plate 30. An example shown in FIG. 12 shows a conceptual representation, and the thicknesses of the shims to be actually inserted in the solenoid coils, respectively, are of the order of a maximum of 3 mm, depending on outside diameters of the coils, and the angles of inclination are of the order of a maximum of 5°. As shown in FIG. 12, the shims 25*a*, 25*b* are inserted in the inside solenoid coil 20 and the outside solenoid coil 21, respectively, for independent inclination adjustment, thereby to enable independent adjustment of the inclination of each of the solenoid coils and thus enable finer correction of the distribution, as compared to when both the inside solenoid coil 20 and the outside solenoid coil 21 are inclined at the same time.

Next, description will be given with regard to means for effecting X-Y movement of the inside solenoid coil 20 and the outside solenoid coil 21.

Figure 14A:
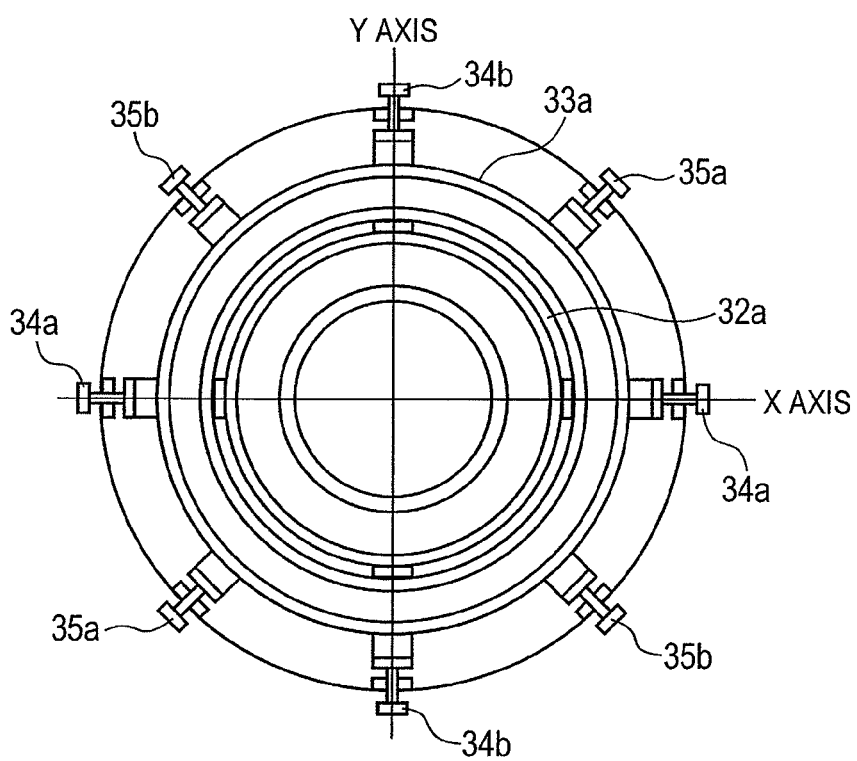
FIG. 14A is a view showing a means for effecting X-Y movement of the solenoid coils of the present invention.
Figure 14B:
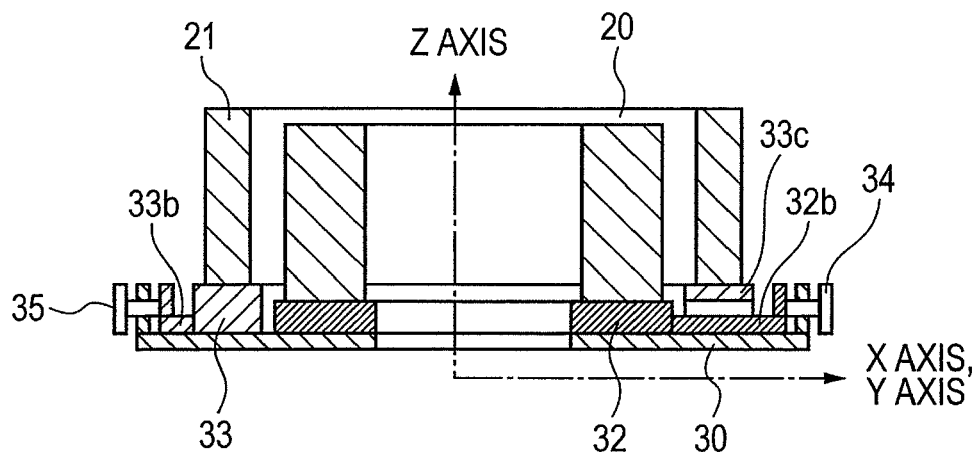
FIG. 14B is a view showing the means for effecting X-Y movement of the solenoid coils of the present invention.
Figure 15:
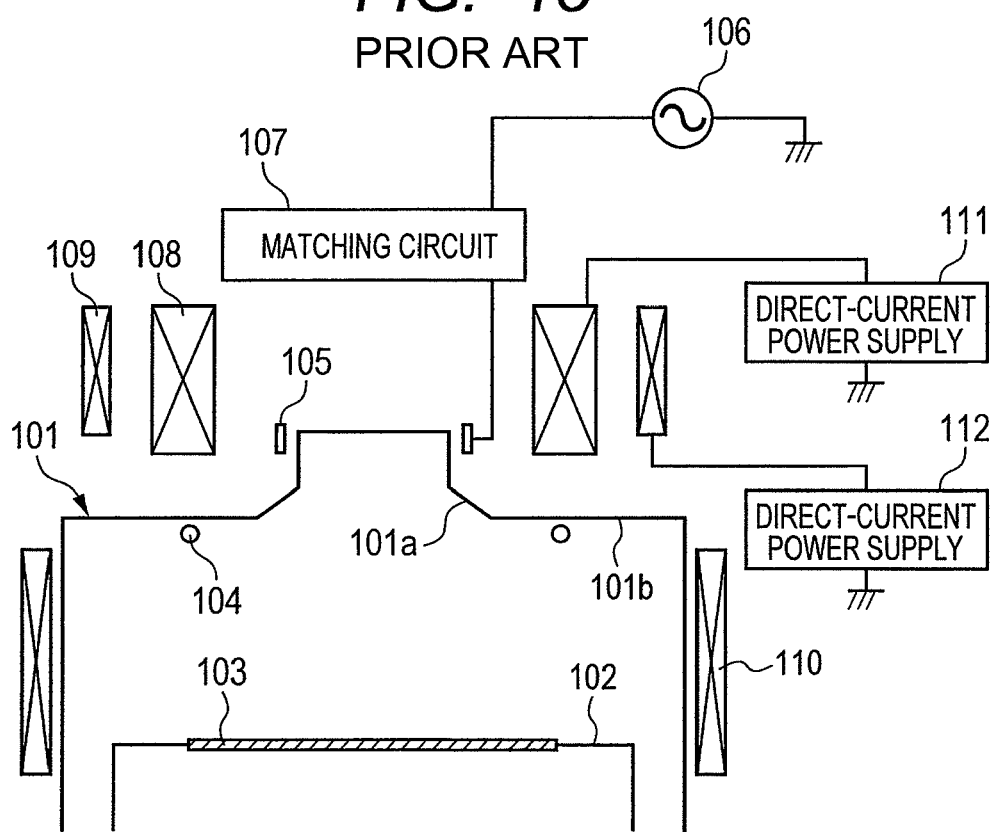
FIG. 15 is a diagram showing an example of a configuration of a conventional plasma treatment apparatus (disclosed in PTL 1).
Figure 16:
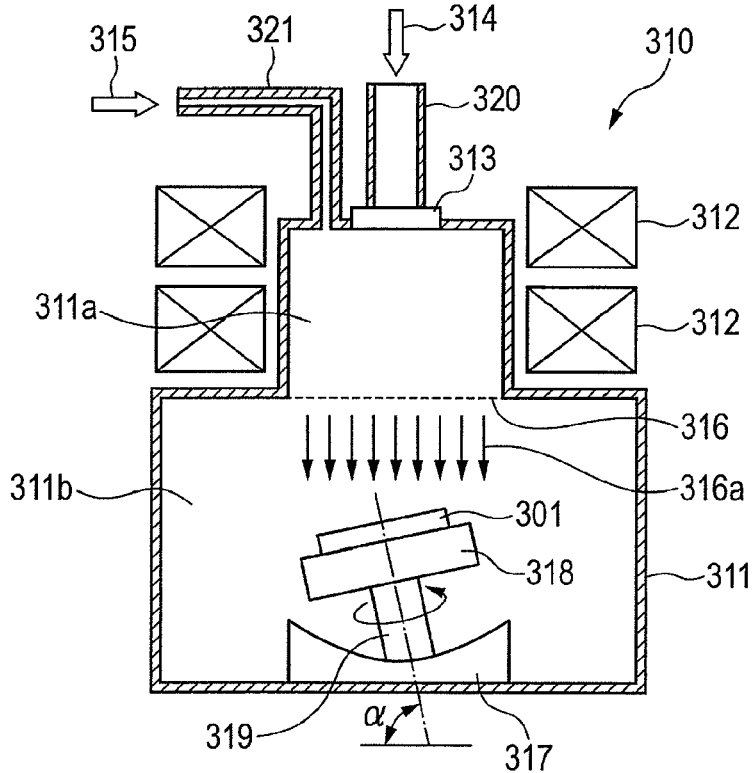
FIG. 16 shows a conventional ECR (electron cyclotron resonance) etching apparatus (disclosed in PTL 2).

Incidentally, as employed herein, the X axis and the Y axis are defined as the axes at right angles to each other in a horizontal plane, and also, the Z axis is defined as the axis at right angles to, or perpendicular to, the horizontal plane. As shown in FIGS. 14A and 14B, a first base plate 32 and a second base plate 33 are axisymmetrically arranged on the base plate 30, as the means for effecting X-Y movement of the inside solenoid coil 20 and the outside solenoid coil 21, and the inside solenoid coil 20 and the outside solenoid coil 21 are placed on the base plates 32, 33, respectively. Incidentally, to incline the inside solenoid coil 20 and the outside solenoid coil 21, spacers are inserted between the base plates 32, 33 and the solenoid coils. Incidentally, FIG. 14B is a cross-sectional view of FIG. 14A.

Description will now be given with regard to the first base plate 32 and the second base plate 33. The first base plate 32 includes a ring-shaped first flange portion 32*a* and four first projection portions 32*b* extending radially outwardly from the first flange portion 32*a*, and the second base plate 33 includes a ring-shaped second flange portion 33*a* and four second projection portions 33*b* extending radially outwardly from the second flange portion 33*a*. The four first projection portions 32*b* are arranged at equally spaced intervals, and the four second projection portions 33*b* are arranged at equally spaced intervals. Although the first base plate 32 and the second base plate 33 are axisymmetrically arranged, the first projection portions 32*b* and the second projection portions 33*b* are arranged in positions rotated 45° about the axis of symmetry so as not to coincide with each other. Also, the first projection portions 32*b* of the first base plate 32 extend outwardly of the second base plate 33 through second notches 33*c* of the second flange portion 33*a*. Meanwhile, an outer periphery of the base plate is provided with means for pressing laterally the first projection portions 32*b* and the second projection portions 33*b* of the respective base plates, for example, first cap screws 34 and second cap screws 35. Actually, for movement of the inside solenoid coil 20 in the direction of the X axis, the inside solenoid coil 20 is moved toward a loosened screw by loosening one of first cap screws 34*a* of the symmetrically disposed first projection portions 32*b* of the four first projection portions 32*b*, and tightening the other first cap screw 34*a*. Likewise, for movement of the inside solenoid coil 20 in the direction of the Y axis, the inside solenoid coil 20 is moved toward a loosened screw by loosening one of first cap screws 34*b* of the first projection portions 32*b* disposed in a direction at right angles to each other, and tightening the other first cap screw 34*b*. Thereby, the X-Y movement of the inside solenoid coil 20 to any position can be accomplished. Likewise, for movement of the outside solenoid coil 21, the outside solenoid coil 21 is moved toward a loosened screw by loosening one of second cap screws 35*a* of the symmetrically disposed second projection portions 33*b* of the four second projection portions 33*b*, and tightening the other second cap screw 35*a*. Likewise, the outside solenoid coil 21 is moved toward a loosened screw by loosening one of second cap screws 35*b* of the second projection portions 33*b* disposed in a direction at right angles to each other, and tightening the other second cap screw 35*b*.

In the above-described first, second or third embodiment, the shim 25 is inserted in the inside solenoid coil 20 and the outside solenoid coil 21 or the drive unit is used to incline the inside solenoid coil 20 and the outside solenoid coil 21 and adjust the angle of inclination of the antenna center line 26 with respect to the coil center line 27, thereby achieving an improvement in the etching distribution. However, the improvement in the etching distribution may not be possible with only the adjustment of the angle of inclination of the antenna center line 26 with respect to the coil center line 27. Specifically, the distribution may deviate due to a parallel shift of a magnetic field rather than the inclination of the magnetic field. In the above case, the means for effecting X-Y movement of the inside solenoid coil 20 and the outside solenoid coil 21 is provided thereby to enable the X-Y movement of the solenoid coils, and thus, the coil center line is translated to coincide with the antenna center line, thereby enabling correction of the distribution.

Next, description will be given with reference to FIGS. 8A to 11D with regard to a procedure for improving an etching rate distribution of a process substrate, which involves measuring a magnetic field by a gauss meter, and adjusting the inclination of the solenoid coils, based on measured results. The gauss meter is an instrument for measuring a magnetic flux density. The gauss meter is capable of not only measurement of ferrites and rare earth magnets but also measurement of electromagnets, pulse generating magnetic fields, and superconducting magnetic fields. The principle of the gauss meter is that a Hall element probe is driven by a constant-current supply, and a Hall voltage produced by a magnetic field is detected by an oscillator and an analog switch.

Figure 8A:
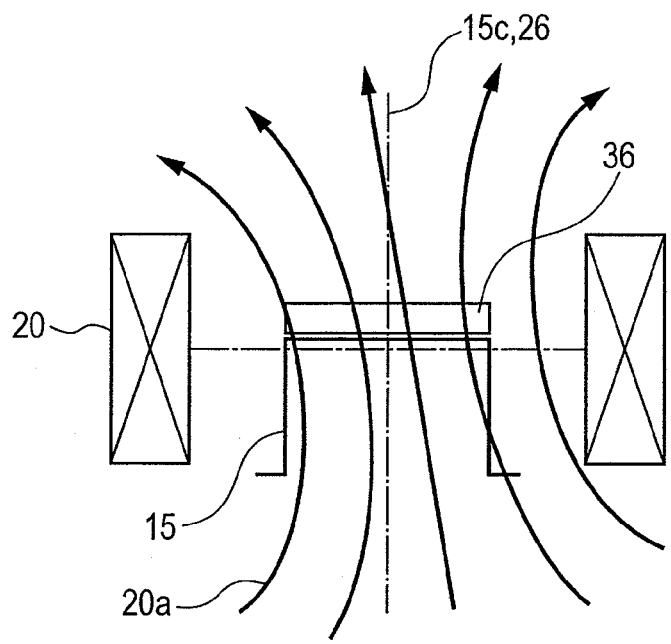
FIG. 8A is a representation of magnetic-line-of-force distribution characteristics before the adjustment of the inclination of the solenoid coil.
Figure 8B:
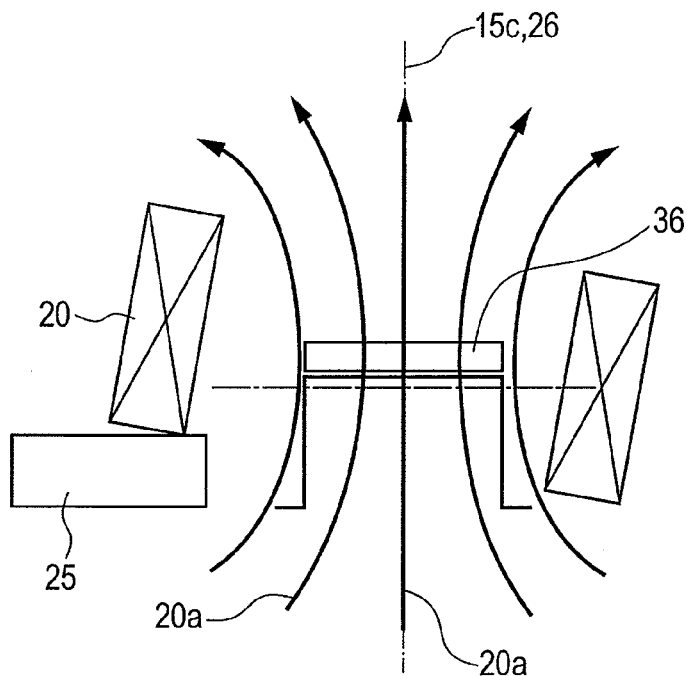
FIG. 8B is a representation of the magnetic-line-of-force distribution characteristics after the adjustment of the inclination of the solenoid coil.
Figure 11A:
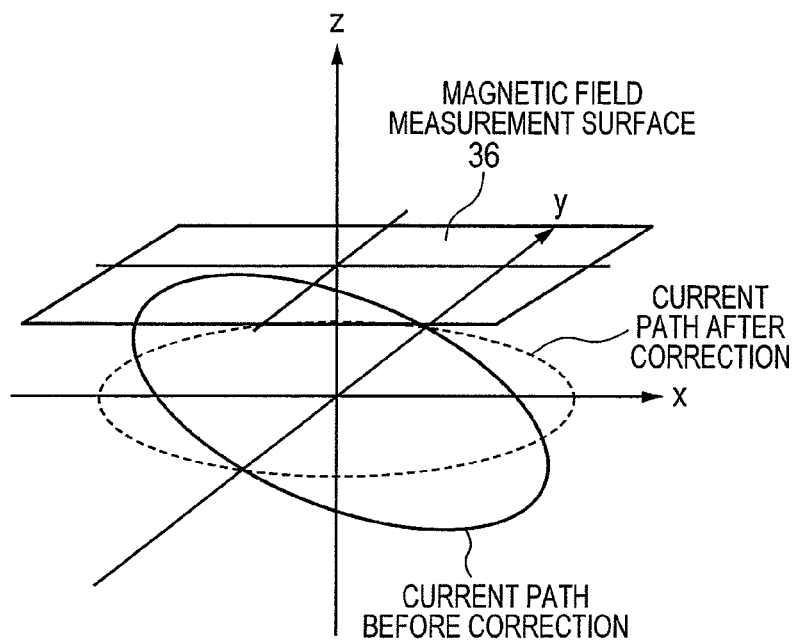
FIG. 11A is a representation of current path characteristics before and after the adjustment of the inclination of the solenoid coil.
Figure 11B:
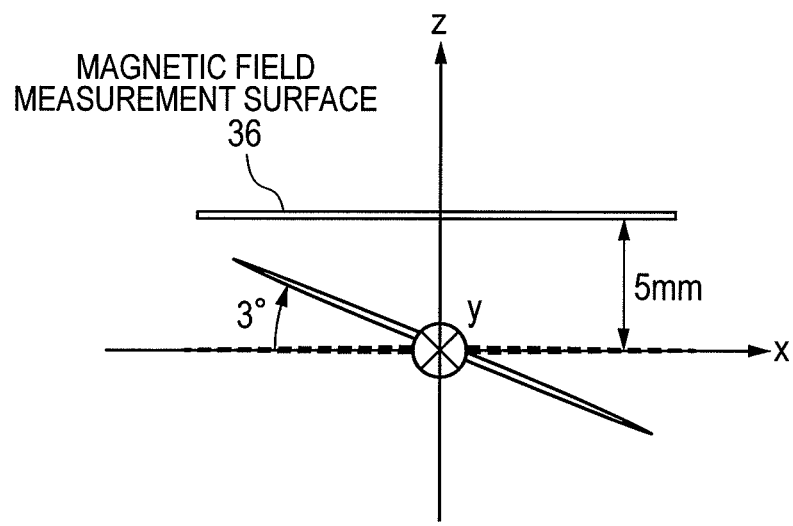
FIG. 11B is a representation of the current path characteristics before and after the adjustment of the inclination of the solenoid coil.

FIGS. 8A and 8B show distributions of magnetic lines of force before and after the adjustment of the inclination of the solenoid coil. Incidentally, for convenience of explanation, FIGS. 8A and 8B show an instance where a current is fed only through the inside solenoid coil 20 to adjust the inclination of the inside solenoid coil 20. In FIGS. 8A and 8B, reference numeral 15c denotes a power supply container center line of the power supply container 15; 20a, magnetic lines of force produced by the inside solenoid coil 20; 25, a spacer; and 36, a magnetic field measurement surface to be measured by the gauss meter. In FIGS. 8A and 8B, it is assumed that the power supply container center line 15c coincides with the antenna center line 26. Before the inclination adjustment of the inside solenoid coil 20, as shown in FIG. 8A, the magnetic lines of force 20a are inclined to the left with respect to the antenna center line 26 and the power supply container center line 15c, and do not have a symmetric distribution. It is possible that the magnetic lines of force 20a do not have the symmetric distribution due to the fact that a perfectly circular coil cannot be formed because wiring in itself that forms the coil has a limited size, rather than due to the fact that a current path is not symmetric about the X axis and the Z axis. Incidentally, the "current path" as employed herein refers to the path through which a current that produces a magnetic field flows. FIG. 11A shows current path distributions measured by the gauss meter before and after the inclination adjustment (correction) of the inside solenoid coil 20. The horizontal axis, or the X axis, and the vertical axis, or the Z axis, of FIG. 11A correspond to the X axis and the Z axis, respectively, shown in FIGS. 12 and 13. As shown in FIG. 11A, the current path before the inclination adjustment (correction) of the inside solenoid coil 20 has an elliptical shape inclined with respect to the X axis and the Y axis as shown by the full line, rather than an elliptical shape that is symmetric about the X axis and the Y axis as shown by the dash lines. As shown in FIG. 11B, the current path before the inclination adjustment (correction) of the inside solenoid coil 20 is in the form of a straight line inclined 3° with respect to the X axis and the Y axis.

FIG. 8B shows an instance where the coil center line 27 is inclined 1° to the right with respect to the antenna center line 26 and the power supply container center line 15c by inserting the shim 25 of 3 mm thick in the inside solenoid coil 20. As shown in FIG. 8B, the distribution of the magnetic lines of force after the inclination adjustment of the inside solenoid coil 20 is symmetric about the antenna center line 26 and the power supply container center line 15c. As shown in FIG. 11A, the current path distribution after the inclination adjustment (correction) of the inside solenoid coil 20 has an elliptical shape that is symmetric about the X axis and the Z axis as the central axes.

Figure 11C:
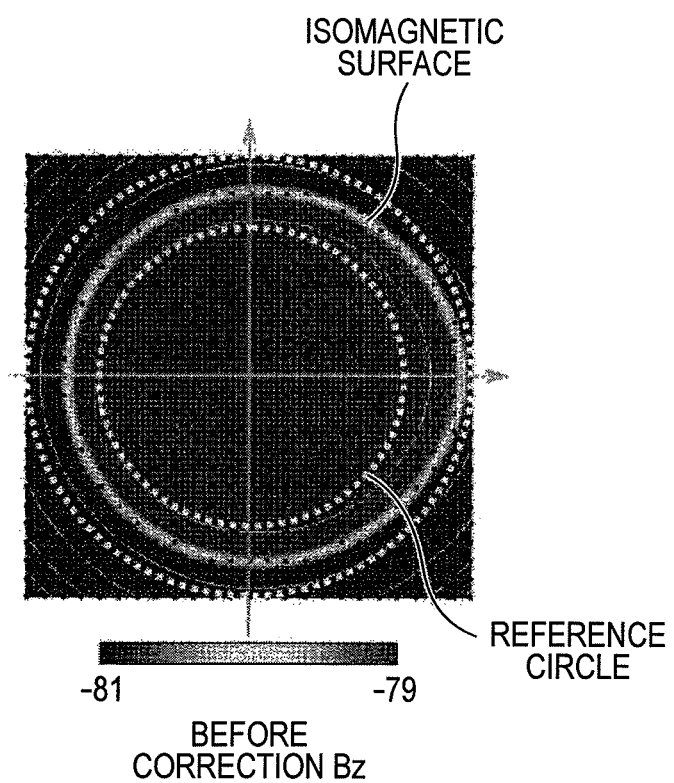
FIG. 11C is a representation of an isomagnetic surface before the adjustment of the inclination of the solenoid coil.
Figure 11D:
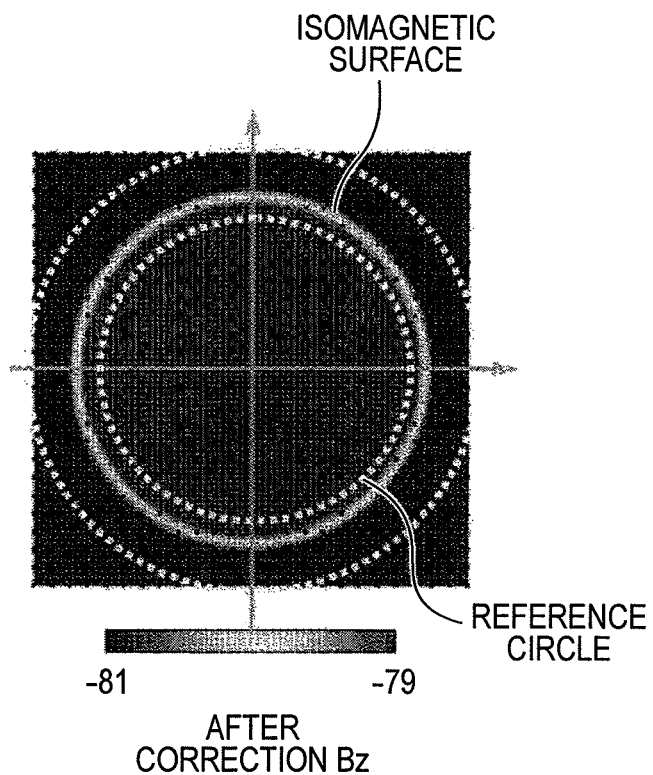
FIG. 11D is a representation of the isomagnetic surface after the adjustment of the inclination of the solenoid coil.

FIGS. 11C and 11D show distributions of an isomagnetic surface before and after the inclination adjustment (correction) of the inside solenoid coil 20. It can be seen that, as shown in FIG. 11C, the isomagnetic surface before the inclination adjustment (correction) of the inside solenoid coil 20 has an oval shape extending in the direction of inclination, whereas, as shown in FIG. 11D, the isomagnetic surface after the inclination adjustment (correction) of the inside solenoid coil 20 has a circular shape.

Figure 9:
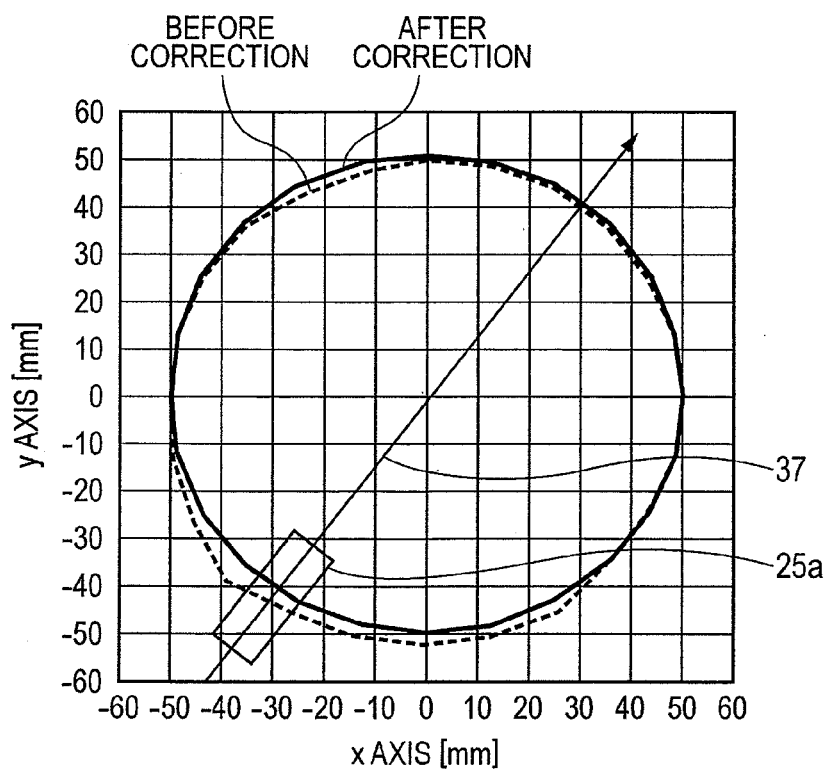
FIG. 9 is a graph showing the magnetic-line-of-force distribution characteristics before and after the adjustment of the inclination of the solenoid coil.
Figure 10:
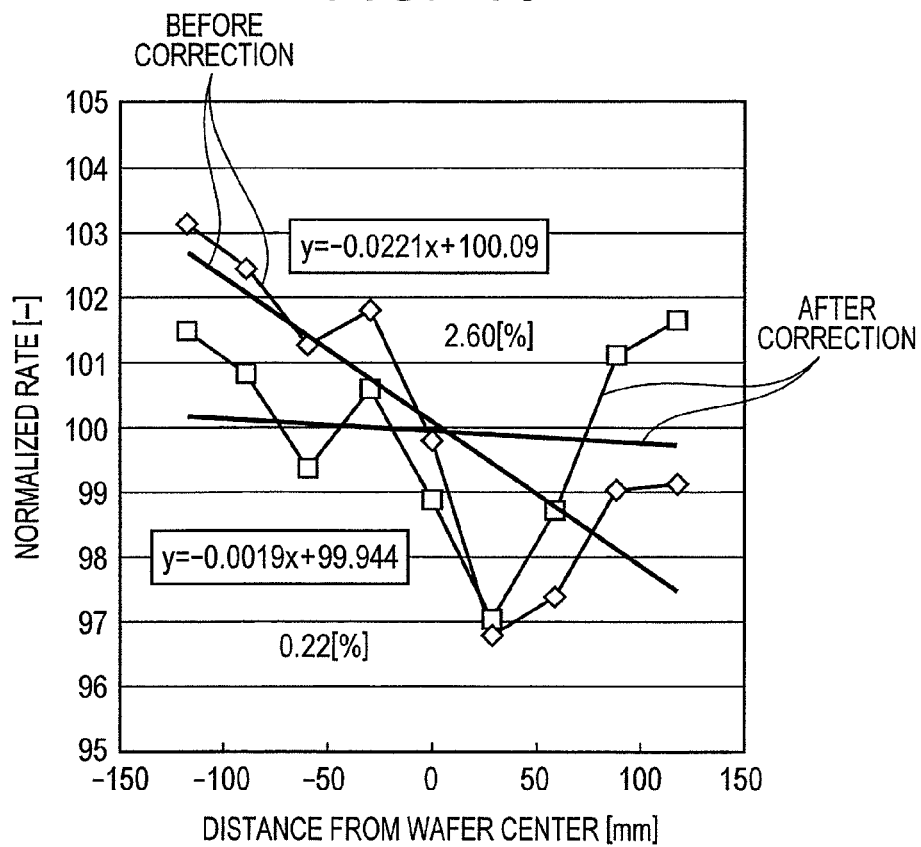
FIG. 10 is a graph showing etching rate characteristics before and after the adjustment of the inclination of the solenoid coil.

FIG. 9 shows magnetic field distributions before and after the inclination adjustment (correction) of the inside solenoid coil 20. The horizontal axis, or the X axis, and the vertical axis, or the Y axis, of FIG. 9 correspond to the X axis and the Y axis, respectively, shown in FIGS. 12 and 13. Incidentally, in FIG. 9, (x, y)=(0, 0) (the X axis: 0 mm, the Y axis: 0 mm) indicates the position of the antenna center line 26 and the power supply container center line 15c. Also, in FIG. 9, reference numeral 25a denotes a virtual spacer position indicating a direction in which the spacer is inserted; and 37, a direction in which the etching rate shown in FIG. 10 is monitored. As shown in FIG. 9, the magnetic field distribution measured by the magnetic field measurement surface 36 of the gauss meter before the inclination adjustment (correction) of the inside solenoid coil 20 has an asymmetric circular shape, provided that (x, y)=(0, 0) (the X axis: 0 mm, the Y axis: 0 mm) is a central point. Specifically, it can be seen that a region of from −50 to 0 mm along the X axis and from −50 to 0 mm along the Y axis is in the form of a distorted circular arc. On the other hand, the magnetic field distribution measured by the magnetic field measurement surface 36 of the gauss meter after the inclination adjustment (correction) of the inside solenoid coil 20 has a symmetric circular shape, provided that (x, y)=(0, 0) (the X axis: 0 mm, the Y axis: 0 mm) is the central point.

FIG. 10 shows the etching distributions before and after the inclination adjustment (correction) of the inside solenoid coil 20. In FIG. 10, the horizontal axis indicates a distance (in mm) from the center of the substrate (0 mm) to the left and right, and the vertical axis indicates the etching rate. Also, in FIG. 10, a square (□) represents the etching rate at each point after the correction, and a rhombus (◇) represents the etching rate at each point before the correction. Also, the value of the etching rate here shown is obtained by normalizing a mean value of the etching rate. As shown in FIG. 10, the etching rate distribution before the inclination adjustment (correction) of the inside solenoid coil 20 is in the form of a straight line inclined to the left. In other words, before the inclination adjustment (correction) of the inside solenoid coil 20, an etching rate of 103 at a point at a distance of 100 mm from the center of the substrate 14 (0 mm) in the leftward direction is significantly different from an etching rate of 97 at a point at a distance of 100 mm from the center of the substrate 14 (0 mm) in the rightward direction. On the other hand, as shown in FIG. 10, the etching rate distribution after the inclination adjustment (correction) of the inside solenoid coil 20 is in the form of a nearly horizontal straight line. In other words, after the inclination adjustment (correction) of the inside solenoid coil 20, an etching rate of 100 at the point at a distance of 100 mm from the center of the substrate 14 (0 mm) in the leftward direction is substantially the same as an etching rate of 100 at the point at a distance of 100 mm from the center of the substrate 14 (0 mm) in the rightward direction. In other words, straight line approximation of the etching rate at each point before the correction (represented by "◇") and the etching rate at each point after the correction (represented by "□") has shown that the distribution before the correction is in the form of a straight line expressed in equation form as: y=−0.0221x+100.09, which is inclined at a great angle, while the distribution after the correction is in the form of a straight line expressed in equation form as: y=−0.0019x+99.944, which is inclined at a smaller angle and is nearly horizontal.

As described above, when the inclination adjustment of the solenoid coils is performed based on results of magnetic field measurement by the gauss meter, discussion of uniformity may be accomplished merely by the magnetic field measurement and thus the required number of etching rate checks is basically one, as compared to when the etching rate distribution is measured by using the optical film thickness measurement instrument and the inclination adjustment of the solenoid coils is performed based on measured results. Therefore, the required number of substrates for use in adjustment of the apparatus is small. Further, an improvement in uniformity in the magnetic field results in an improvement in uniformity in plasma and in turn leads to an improvement in the etching rate distribution. Also, damage caused by non-uniformity in the plasma can be suppressed.

In the above-described first, second and third embodiments, description has been given with regard to an example in which the inclination adjustment means such that the coil center line 27 as the axis of symmetry of the solenoid coils is inclined at a predetermined angle with respect to the antenna center line 26 as the axis of symmetry of the annular antenna is mounted to the solenoid coils 20, 21. However, any means may be used, provided only that any one of the coil center line 27 and the antenna center line 26 is inclined at a predetermined angle relatively to the other center line. In other words, an inclination adjustment means such that the antenna center line 26 as the axis of symmetry of the annular antenna 16 is inclined at a predetermined angle with respect to the coil center line 27 as the axis of symmetry of the solenoid coils may be mounted to the annular antenna 16 such that the antenna center line 26 as the axis of symmetry of the annular antenna 16 is inclined at the predetermined angle with respect to the coil center line 27 as the axis of symmetry of the solenoid coils. This enables correcting unevenness in the plasma density distribution, thus achieving uniform substrate treatment.

Figure 17:
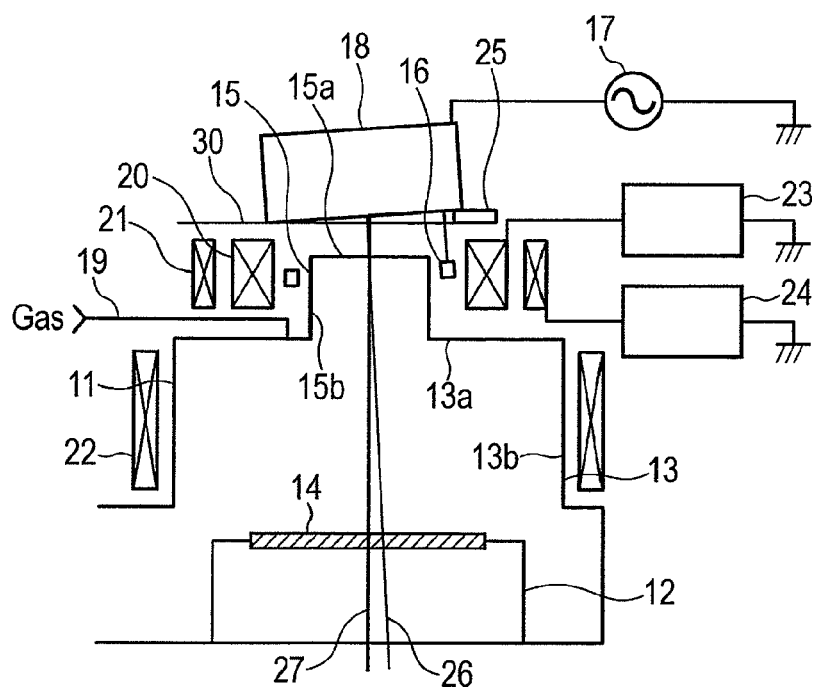
FIG. 17 is a diagram showing an annular antenna as inclined by tilting a matching circuit according to the embodiment of the present invention.
Figure 18:
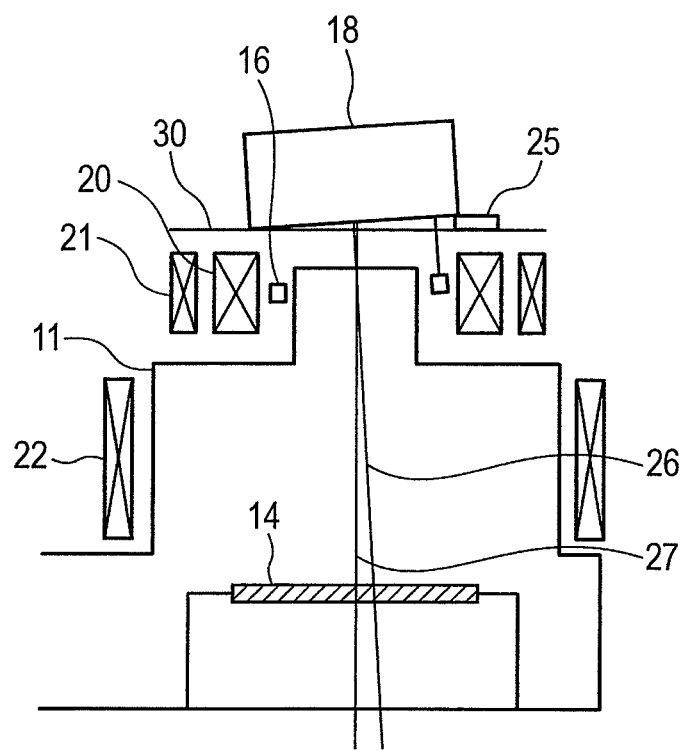
FIG. 18 is a diagram of assistance in explaining the state of inclination of the annular antenna according to the embodiment of the present invention.

FIGS. 17 and 18 show a configuration in which the antenna center line 26 is inclined. A basic configuration is the same as that of the first embodiment and, therefore, description of the basic configuration will be omitted, and description will be given only with regard to a point of difference. In the configuration of FIGS. 17 and 18, the inclination adjustment means 25 (e.g. the shim) is inserted between the base plate 30 and the matching circuit 18 and, as a result, the annular antenna 16 connected to the matching circuit 18 is inclined, as distinct from the first embodiment. Therefore, the antenna center line 26 is inclined at a predetermined angle with respect to the coil center line 27. Incidentally, in this configuration, the matching circuit 18 is inclined thereby to indirectly incline the annular antenna 16; however, the inclination of the annular antenna 16 may be directly adjusted. Also, both the antenna center line 26 and the coil center line 27 may be inclined.

The invention claimed is:
1. A plasma treatment apparatus for treating a substrate with plasma comprising:
  a container capable of placement of the substrate therein and comprising an upper end wall that is substantially parallel to an upper surface of the substrate and a side wall that is substantially perpendicular to the upper surface of the substrate and extends from the upper end wall toward the upper surface of the substrate;
  an antenna that has a one-loop annular shape opened in a portion and is provided around an outer periphery of the side wall of the container and below the upper end wall so as to generate the plasma in the container;
  a radio-frequency power supply for supplying a radio-frequency power to the antenna;
  magnetic field generating means provided around an outer periphery of the antenna so as to generate a magnetic field in the container and thereby diffuse the plasma;
  a direct-current power supply for supplying a direct current power to the magnetic field generating means;
  a base plate that supports the magnetic field generating means; and
  inclination adjustment means for inclining the magnetic field generating means,
  wherein the magnetic field generating means includes a first solenoid coil and a second solenoid coil that are concentrically arranged,
  wherein the direct-current power supply and the inclination adjustment means are provided for each of the first solenoid coil and the second solenoid coil,
  wherein the inclination adjustment means is a plate-shaped member provided between the magnetic field generating means and the base plate,
  wherein a center line of the antenna is located coaxially of a center line of the container and a center line of the substrate, and
  wherein the inclination adjustment means inclines a center line of the first solenoid coil and a center line of the second solenoid coil at a predetermined angle with respect to the center line of the antenna so that a center of an isomagnetic surface of a magnetic field formed by the first and the second solenoid coils is located on the center line of the antenna and the isomagnetic surface has a circular shape in a plane perpendicular to the center line of the antenna.

2. The plasma treatment apparatus according to claim 1, wherein the antenna is configured to be substantially axisymmetric about a first axis and surrounds the first axis,
  each of the first solenoid coil and the second solenoid coil is a solenoid coil configured to be substantially axisymmetric about a second axis and surrounds the second axis, and
  each of the first solenoid coil and the second solenoid coil is inclined by the inclination adjustment means such that the first axis and the second axis form a predetermined angle with each other.

3. The plasma treatment apparatus according to claim 2, wherein the angle formed by the first axis and the second axis lies between 0° and 5°.

4. The plasma treatment apparatus according to claim 1, wherein the container includes a power supply container having a cylindrical shape consisting of the upper end wall and the side wall to generate the plasma therein, and a process container being capable of placement of the substrate therein and connected to the power supply container such that an internal space of the process container communicates with an internal space of the power supply container.

5. The plasma treatment apparatus according to claim 1, wherein the first solenoid coil and the second solenoid coil are disposed around the outer periphery of the antenna and around the outer periphery of the side wall.

* * * * *